United States Patent [19]

Desaigoudar et al.

[11] Patent Number: 5,370,766
[45] Date of Patent: Dec. 6, 1994

[54] METHODS FOR FABRICATION OF THIN FILM INDUCTORS, INDUCTOR NETWORKS AND INTEGRATION WITH OTHER PASSIVE AND ACTIVE DEVICES

[75] Inventors: Chan M. Desaigoudar, Los Gatos; Suren Gupta, San Jose, both of Calif.

[73] Assignee: California Micro Devices, Milpitas, Calif.

[21] Appl. No.: 107,246

[22] Filed: Aug. 16, 1993

[51] Int. Cl.$^5$ .................. B44C 1/22; C23F 1/00; C03C 15/00
[52] U.S. Cl. ................... 156/643; 156/644; 156/656; 156/659.1; 156/901; D29/620; 437/228
[58] Field of Search ............... 156/643, 644, 653, 656, 156/657, 659.1, 901, 902; 29/602.1, 603, 606, 607, 610.1, 620; 204/192.2, 192.21; 427/131, 132; 437/228, 245

[56] References Cited

U.S. PATENT DOCUMENTS 5,071,509 12/1991 Kano et al. .................. 156/644
5,227,012 7/1993 Brandli et al. ................ 156/643

OTHER PUBLICATIONS

Electromagnetics for Engineers, Steven E. Schwarz, Saunders College Publishing, pp. 60-64, 1990.

*Primary Examiner*—William Powell
*Attorney, Agent, or Firm*—Steven P. Caserza

[57] ABSTRACT

The fabrication of thin film inductors on a substrate, which may include thin film resistors, thin film capacitors, and semiconductor devices. In one embodiment an inductor is fabricated initially on a substrate and then integrated with other devices subsequently formed on the substrate. In this embodiment, process steps used to fabricate such other devices utilize temperatures sufficiently low to prevent damaging or destroying the characteristics of the inductor. In another embodiment the fabrication of an inductor is achieved through photoresist masking and plating techniques. In alternative embodiments, fabrication of an inductor is achieved by sputtering, photoresist processes and etching/ion-milling techniques. A combination of various individual process steps from various embodiments are suitable for use to fabricate the individual layers to achieve a structure of this invention. The inductor fabricated in accordance with this invention is connected to other passive or active components through metal interconnections in order to improve the frequency performance of the inductor. In certain embodiments, parasitic capacitance of the inductor is significantly reduced by fabricating inductor coils on dielectric bridges. In certain embodiments, a magnetic core of ferromagnetic material is used to improve the performance of the inductor at frequencies below about 100 MHz.

107 Claims, 10 Drawing Sheets

METHODS FOR FABRICATION OF THIN FILM INDUCTORS, INDUCTOR NETWORKS AND INTEGRATION WITH OTHER PASSIVE AND ACTIVE DEVICES

FIELD OF THE INVENTION

This invention relates generally to the integration of passive components on a single substrate, with or without other semiconductor components and devices. In particular, it relates to integration of resistors, capacitors and inductors on the same substrate with or without semiconductor devices.

BACKGROUND OF THE INVENTION

In the past inductors have been fabricated using conductive coils with or without high permeability cores such as ferrites, as shown in FIG. 1. The inductor is mounted on a substrate and then mounted on a circuit board according to application desired. Integration of these coils with resistors, capacitors, resistor-capacitor networks, or semiconductor devices have not been achieved. Typically, whenever a coil is used as an inductor, it is mounted as a separate part in series with the integrated circuit to achieve the desired functions.

Inductors fabricated using wound coils inherently provide low resistance for a given inductance value, because of their wire thickness and high inductance due to the use of ferrites or other high permeability materials as the core. The combination of coil inductor with other passive components or integrated circuits consumes space on a printed circuit board and also results in a performance degradation due to the necessary interconnects. While several attempts have been made to integrate inductors with integrated circuits, the process used for doing these integrations is complex and expensive. Such prior art is described in Electromagnetics for Engineers, Steven G. Schwartz, Saunders College Publishing, 1990. FIG. 2 shows a top view of a prior art thin film inductor, which is fabricated on a GaAs or ceramic substrate.

Many modern applications, particularly high frequency applications, lend themselves to the integration of inductors with other passive components such as resistors, capacitors, and semiconductor integrated circuits. The integration necessity stems from cost savings, reliability, performance improvements, and space savings on circuit boards and general miniaturization in height, length, and width.

OBJECTS OF THE INVENTION

It is an object of the invention to provide a process for the fabrication of an inductor.

It is another object of the invention to provide various options of fabrication leading to various frequency applications of the inductor, thus covering range of applications from 0–50 Ghz.

It is still another object of this invention to provide for integration of inductors with other passive components such as resistors, capacitors, and resistor-capacitor networks.

It is further an object of this invention to provide for integration of inductors with semiconductor integrated circuits.

It is yet another object of the invention to provide methods for reducing the parasitic capacitance of inductors to extend the inductor application to higher frequencies.

It is further an object of the invention to fabricate inductors on top of existing devices such as integrated circuits, and on the backside of a substrate, to save integrated circuit surface area, leading to additional cost saving.

It is still further an object of this invention to fabricate inductors using various substrates such as, but not limited to, silicon, ceramic, glass, quartz, Alumina, $Al_2O_3TiC$, ferromagnetic materials, etc.

It is still further an object of this invention to provide a method of fabricating inductor networks, inductor-capacitor networks, inductor-resistor networks, and inductor-capacitor- and resistor networks.

It is further an object of this invention to provide a method for the fabrication of inductors with high permeability cores to increase inductance, and which are capable of being integrated with other components or circuits.

It is further an object of this invention to fabricate inductor-diode networks, with or without integration with resistors, capacitors, or resistor-capacitor networks.

It is still further an object of this invention to provide a variety of packaging and bonding options for inductors and inductors integrated with other components.

It is still further an object of this invention to provide a variety of passivation options for the fabrication of inductors and integrated inductors.

It is still further an object of this invention to provide multilayer and/or multiturn inductors for applications in various frequency ranges (i.e. from 1 turn to greater than 100 turns).

It is another object of this invention to provide a method and structure for clamping inductor coils or interconnects to minimize damage during handling, processing, packaging, or use of passive or active devices.

SUMMARY

The foregoing and other objects of the invention may generally be achieved by the fabrication of the passive components or semiconductor devices with known techniques or new techniques and then fabricating inductors as described in this invention.

In another embodiment of this invention, an inductor is fabricated initially on a substrate and then integrated with other devices subsequently formed on the substrate. In this embodiment, process steps used to fabricate such other devices utilize temperatures sufficiently low to prevent damaging or destroying the characteristics of the inductor.

In one embodiment of this invention, the fabrication of an inductor is achieved through photoresist masking and plating techniques. In alternative embodiments, fabrication of an inductor is achieved by sputtering, photoresist processes and etching/ion-milling techniques. A combination of various individual process steps from various embodiments are suitable for use to fabricate the individual layers to achieve a structure of this invention.

The inductor fabricated in accordance with this invention is connected to other passive or active components through metal interconnections in order to improve the frequency performance of the inductor. In certain embodiments, parasitic capacitance of the inductor is significantly reduced by fabricating inductor coils on dielectric bridges. In certain embodiments, a magnetic core of ferromagnetic material such as NiFe alloy, sandust, or ferrite is used to improve the performance of the inductor at frequencies below about 100 MHz.

BRIEF DESCRIPTION OF DRAWINGS

The foregoing and other objects of the invention will become apparent in reading the following detailed description and in reference to the following drawings:

FIGS. 7-1 and 7-2 depict cross-sectional views of alternative fabrication steps which may be employed to fabricate patterned metalization layer 63 of FIG. 6e;

DETAILED DESCRIPTION

Figure 3:
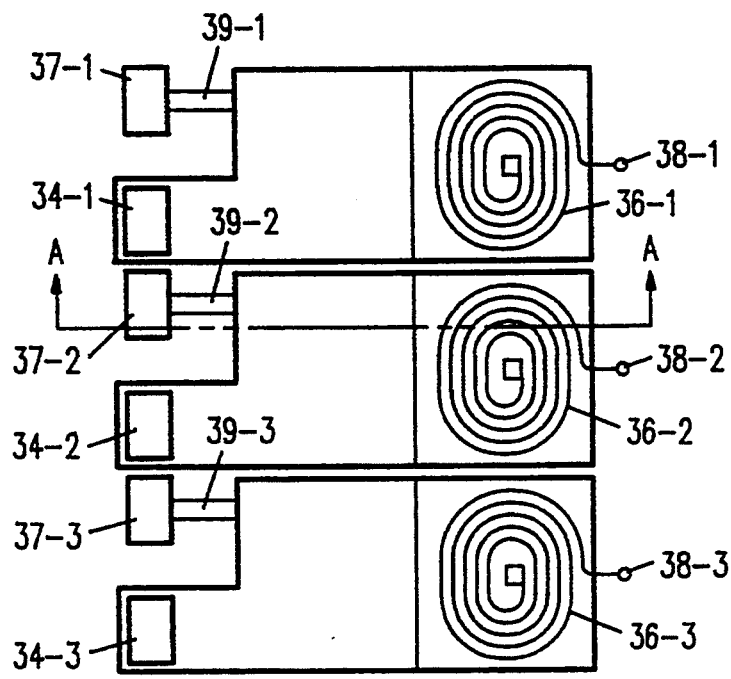
FIG. 3 shows the layout of one embodiment of an integrated LRC network constructed in accordance with the present invention.

FIG. 3 is a top view of an example of a structure constructed in accordance with the teachings of this invention which includes a plurality of RLC networks, each including a thin film resistor (39-1 through 39-3), capacitor (40-1 through 40-3), and inductor (36-1 through 36-3).

Figure 4:
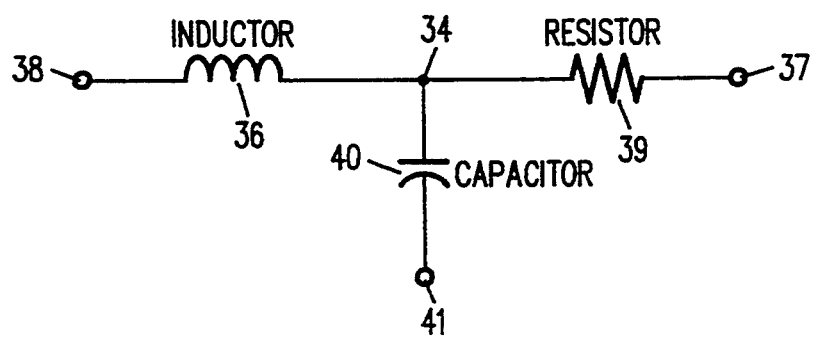
FIG. 4 is a schematic diagram of the LRC network of FIG. 3.

FIG. 4 is a schematic diagram depicting one way of interconnecting one set of thin film resistor, capacitor, and inductor of the circuit of FIG. 3 as an RLC network, with similar reference numerals used. Thus, referring to FIGS. 3 and 4, this embodiment includes an inductor 36 having an inductor coil terminal pad 38 suitable for connection to external devices. As show in FIG. 3, thin film resistor 39 is formed as a patterned thin film resistive layer and capacitor 40 is formed of two plates. In the embodiment in which the substrate on which a thin film network of FIGS. 3 and 4 is formed comprises a semiconductor material, one plate of capacitor 40 is, if desired, conveniently formed as a portion of that semiconductor material, with terminal 41 serving as a connection to that substrate plate of capacitor 40. Naturally, it will be appreciated by those of ordinary skill in the art in light of the teachings of this invention that the combination of thin film resistor, capacitor, and inductor can be electrically interconnected in different ways to obtain different electrical characteristics and furthermore that the electrical characteristic of each component can be selected over a wide range. Furthermore, any number, including zero, of each of thin film resistors, capacitors, and inductors can be integrated to achieve more complex circuit functions. Also, such combination of thin film resistors, capacitors, and inductors can be integrated with semiconductor devices such as those which are fabricated using well known semiconductor processing techniques prior to the formation of the thin film resistors, capacitors, and inductors, which thin film devices are constructed in accordance with certain embodiments of this invention utilizing low temperature processes which will not adversely affect previously fabricated semiconductor devices and regions.

Figure 5:
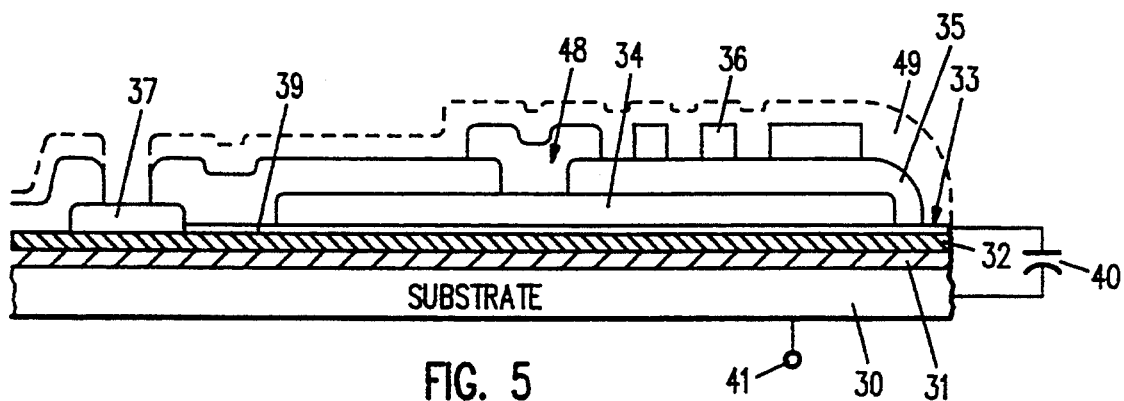
FIG. 5 is a cross-sectional view of an integrated LRC network such as that shown in FIG. 3.

FIG. 5 is a cross-sectional view of the embodiment of FIG. 3, with similar reference numerals used. As shown in FIG. 5, layer 33 serves as a resistive layer, thereby forming resistor 39 at the location shown. Resistive layer 33 is conveniently formed of a suitable resistive material and, if necessary, doped or otherwise treated to have a desired resistivity. Suitable materials for resistive layer 33 include TaN, Nichrome, polycrystalline silicon, etc. Still referring to FIG. 5, resistive layer 33 serves as a top plate of capacitor 40 which is inherently connected to one end of resistor 39 and which is connected through via 48 to one end of inductor 36 for the circuit configuration of this example which is shown in FIG. 4. Substrate 30 serves as the opposite plate of capacitor 40 in this example, and contact to this substrate plate capacitor 40 could be made on the top surface of the device utilizing a suitable via making contact with substrate 30, or through a backside contact 41 as shown in FIG. 5. A passivation layer 49 protects the surface of the device. Also shown in FIG. 5 are dielectric layers 31 and 32, inductor coil terminal pad 34, and dielectric layers 35 and 37.

FIGS. 6a–6f are cross-sectional views illustrating an inductor fabricated in accordance with one embodiment of this invention. This embodiment provides an inductor suitable for medium frequency (approximately 50 MHz–1 GHz) applications. In this exemplary embodiment, substrate 71 is heavily doped N type silicon. However other substrates such as glass, quartz, $Al_2O_3$/TiC, ceramics, ferromagnetic materials, and semiconductor materials other than silicon are also appropriate substrate materials, and different doping types and levels are also suitable when semiconductor material is used as substrate 71. In one embodiment, substrate 71 is silicon of <100> crystal orientation, consistent with typical semiconductor silicon substrates, although other silicon of other crystal orientations is suitable for use as substrate 71. Also, when a semiconductor material is used as substrate 71, either P or N conductivity type is suitable, as well as any convenient doping level, although heavier doping is desirable when capacitors are formed in accordance with this invention in which one capacitor plate is formed as a portion of substrate 71.

Figure 6A:
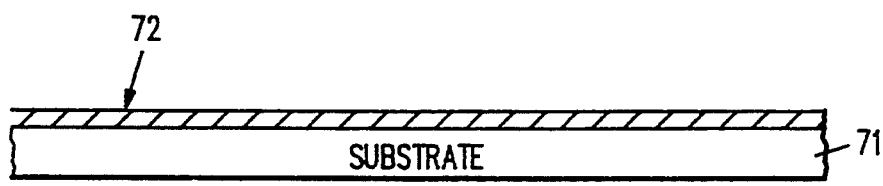
FIGS. 6a–6f depict the cross-sectional views of the fabrication steps of a medium frequency inductor without a magnetic core in accordance with this invention.

A layer of dielectric material 72 is grown or deposited on the surface of substrate 71, as shown in FIG. 6a.

In one embodiment, dielectric layer 72 is formed of thermally grown silicon dioxide of approximately 10,000 Å in thickness. Alternatively, other dielectric material can be used as dielectric layer 72, such as silicon nitride or a sandwich of oxide and nitride.

Figure 6B:
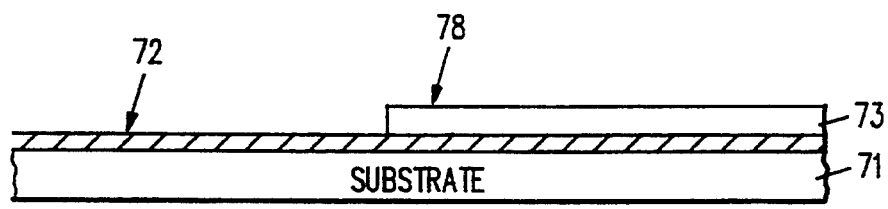

As shown in FIG. 6b, a layer of metal 73 is formed on the surface of dielectric layer 72. In one embodiment, metal layer 73 is aluminum or an aluminum alloy, which is formed by sputtering to an approximate thickness of 5000 Å. Other metals and conductive materials are also suitable, such as copper, aluminum, silver, gold, and the like, which may be formed to desired thicknesses based on conductivity, current handling, and reliability requirements.

Referring to FIG. 6b, metal layer 73 is patterned to form the desired electrical interconnect pattern (not shown) and inductor coil terminal pad 78 for, ultimately, external connection to one side of the to-be-formed inductor. This step of patterning metal layer 73 may be conveniently performed using conventional photoresist masking techniques, followed by removal of exposed portions of metal layer 73, for example by conventional processes such as plasma or chemical etching, or ion milling. If desired, this step of forming conductive interconnects can be simultaneously used to fabricate electrical interconnects for use with active components previously formed in a semiconductor substrate 71.

Figure 6C:
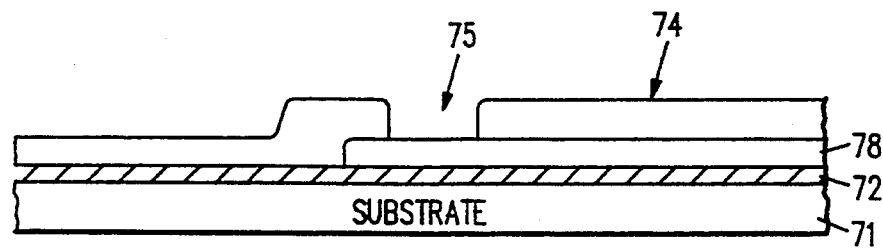

Another layer of dielectric material 74 is formed on the surface of the device, as shown in FIG. 6c. In one embodiment dielectric layer 74 is silicon dioxide or nitride deposited by a Chemical Vapor Deposition (CVD) process or a Plasma Enhanced Chemical Vapor Deposition (PECVD) process, for example to a thickness within the range of approximately 2000 Å to 10,000 Å. Alternatively, a layer of baked photoresist (typical thickness of 1–5 microns) is used as dielectric layer 74, which is selectively patterned to remain at desired areas through a conventional photoresist masking process and then baked at approximately 200°–300° C. for approximately six to twelve hours in a vacuum or inert environment to form desired dielectric layer 74. Alternatively, an electron beam is used to polymerize photoresist to form a stable dielectric layer.

In an embodiment in which dielectric layer 74 is oxide or nitride, conventional photoresist and etching processes are used to remove portions of dielectric layer 74 from selected areas to allow electrical connection to portions of metal layer 74, such as at area 75 to allow electrical contact to inductor coil terminal pad 78 and thus one end of the inductor. Such a photoresist process typically consists of applying photoresist, bake, exposure to ultraviolet light with an appropriate mask, photoresist develop, and removal of undesired portions of the dielectric, for example by chemical or oxygen plasma, as is well known in the art. This exposes a portion of dielectric layer 74 where contact to underlying metal is to be made, for example to inductor terminal pad 78.

Figure 6D:
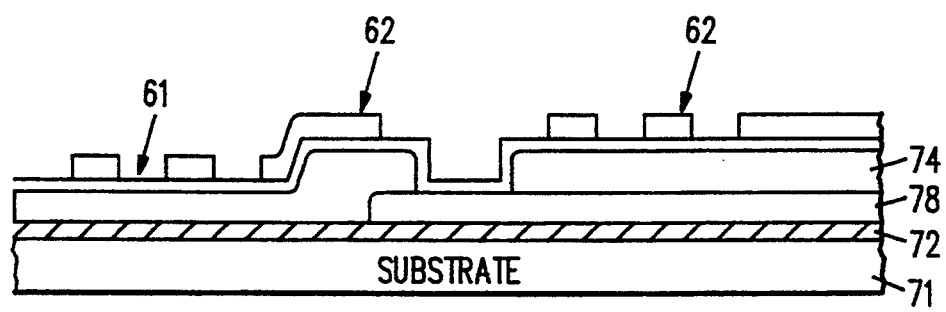
Figure 6E:
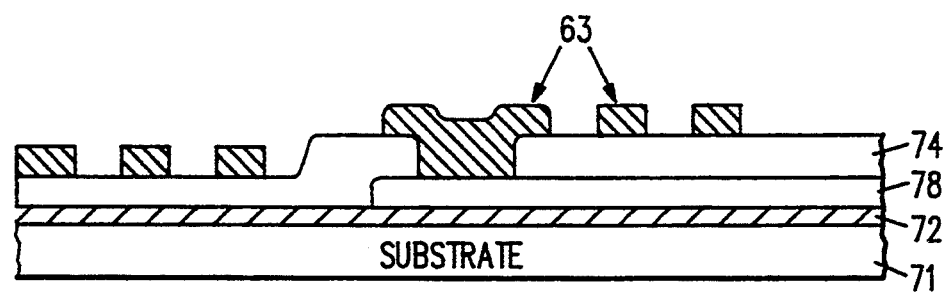
Figure 6F:
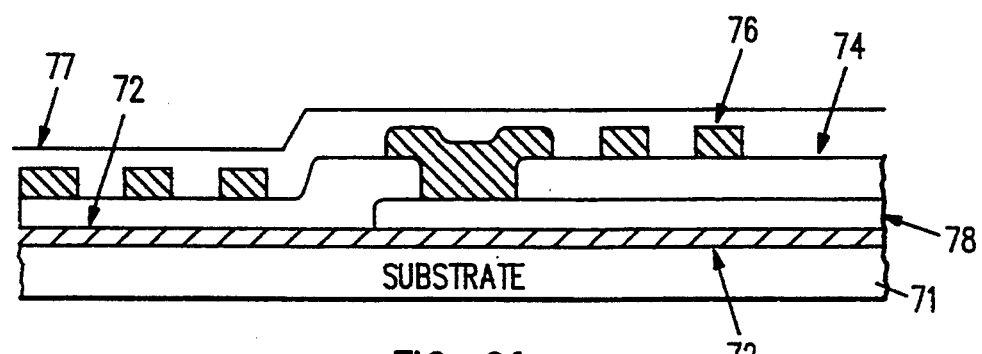

An inductor coil is now formed on dielectric layer 74, in one of a number of possible ways, each of which consists of forming an inductor coil of conductive traces 76 (FIG. 6f). Any one or more of a number of conductive materials can be used to form conductive traces 76, including but not limited to aluminum, copper, silver, and gold. The thickness and area of conductive traces 76 is chosen based on desired conductivity, reliability, and performance desired.

In one embodiment, depicted in FIGS. 6d and 6e, a layer of conductive material 61 is formed and masked to expose the desired inductor coil pattern, with any desired electrical interconnects (not shown) being formed simultaneously and which can, if desired, make physical and electrical contact to inductor coil terminal pad 78. In this embodiment, a conductive layer 61 serves as a seed layer is formed on the surface of the device. The seed layer may comprise any one or more materials which provide a suitable interface with good adhesion qualities, such as but not necessarily limited to any one or combination of TiW, Cu, Pd, Ti, Ni, Cr, Ag, Au, and NiFe. In one embodiment, seed layer 61 is formed of a first layer of TiW of a thickness of approximately 200 Å, and a second layer of copper formed to a thickness of approximately 1000 Å, which layers may be conveniently formed using conventional sputtering or other vacuum deposition techniques. A layer of photoresist 62 is then formed and patterned to expose those portions of seed layer 61 where the inductor coil is to be formed. The inductor coil is then formed, for example by electroplating to exposed portions of seed layer 61 another layer of conductive material 63 (FIG. 6e), such as copper, gold or silver, which may be conveniently formed by a conventional electroplating process onto the seed layer inductor coil pattern, for example to a thickness of approximately 3–10 microns. Other conductive materials can be used for form inductor coils 76, which have adequate electrical and thermal conductivity and are suitably reliable. Patterned photoresist layer 62 is then removed, followed by an etch of the portions of seed layer 61 which were protected by photoresist layer 62 and thus not covered by conductive material 63. When seed layer 61 is of TiW, it may be removed where not covered by the electroplated material 63 forming inductor coils 76 by, for example, etching in 5% $NH_4HSO_4$, followed by etching in mixture of $H_2O_2$, $H_2SO_4$ and DI water. This process forms coils 76 as an inductor, without conductive material remaining between the inductor coil traces. Conductive material 63 may, depending on the etchant used to remove exposed portions of seed layer 61, be slightly etched by an inconsequential amount. Seed layer 61 may also, alternatively, be removed by dry etching processes such as plasma etch, sputter etch, or ion milling.

Figure 1:
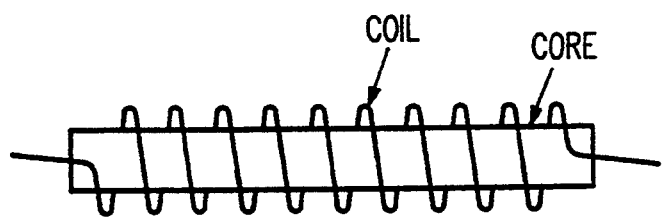
FIG. 1 shows a prior art inductor fabricated using a wire coil.
Figure 2:
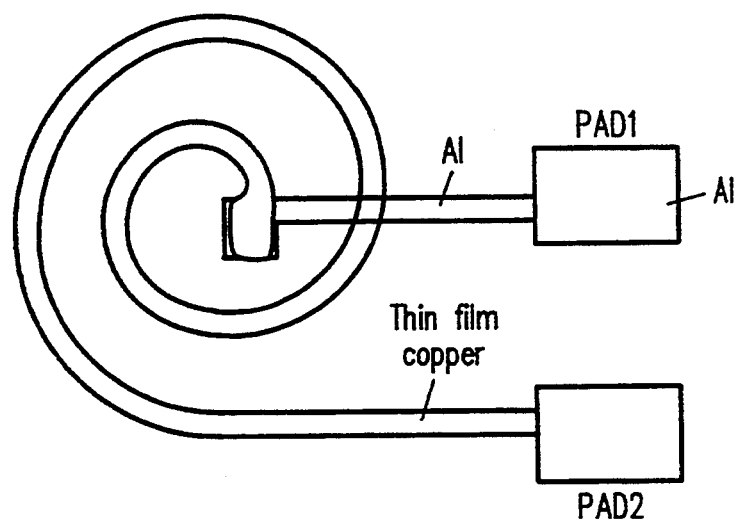
FIG. 2 shows the layout of a prior art thin film inductor.
Figures 1, 7:
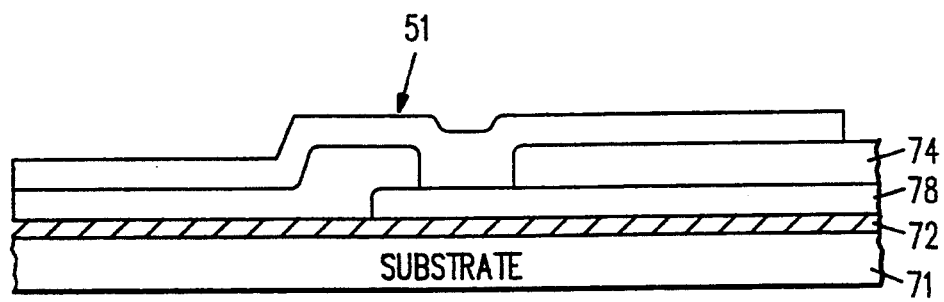
Figures 2, 7:
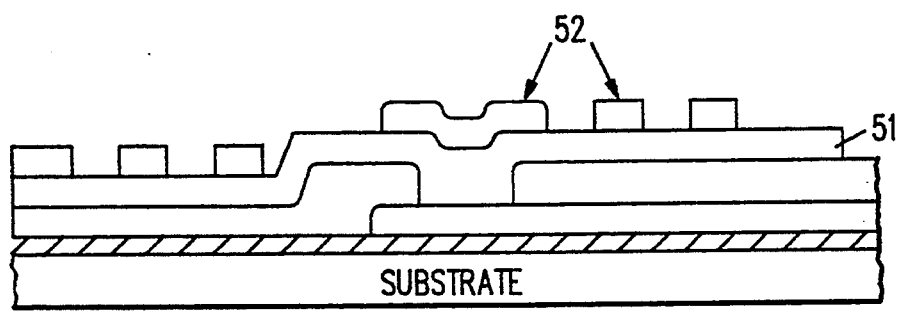

In an alternative embodiment, patterned conductive layer 63 is formed in any other convenient manner, for example by utilizing standard metalization and patterning techniques. This is shown, for example, in the cross-sectional views of FIGS. 7-1 and 7-2. Referring to FIG. 7-1, following the exemplary process steps depicted in FIGS. 6a–6c, a metalization layer 51, (as shown in FIG. 7-1) is formed, for example by sputtering or vacuum depositing aluminum, gold, silver, or other suitable conductive material. Then, as shown in the cross-sectional view of FIG. 7-2, a layer of photoresist 52 is formed and patterned to protect those portions of metalization layer 51 which are to remain in order to form inductor coils 76 (FIG. 6f) and any desired interconnection pattern to be formed from metalization layer 51. Undesired portions of metalization 51 which are thus exposed by patterned photoresist layer 52 are then removed, for example by conventional etching techniques such as wet or plasma etching, or ion milling. This results in a structure as shown in FIG. 6e, including a patterned metalization layer 63.

With the structure of FIG. 6e attained in any convenient manner, including the alternative embodiments described above, the surface of the device, including one or more inductor coils 76, are passivation protected by applying a suitable passivation layer 77 (FIG. 6f), followed by a pad mask step to remove portions of the passivation layer covering areas such as bonding pads to which external connection is to be made. In one embodiment, photoresist itself (typical thickness about 1–5 microns) is used as passivation layer 77, for example by using a standard photolithographic process followed by photoresist bake at approximately 200°–300° C. The photolithography process leaves photoresist as a passivation layer in the desired areas while removing it from areas such as bonding pads. Alternatively, an electron beam is used to polymerize photoresist to form a suitable and durable passivation layer.

FIGS. 8a–8g illustrate an inductor fabricated in accordance with an alternative embodiment of this invention. This embodiment provides inductors suitable for high frequency (approximately 100 MHz to 50 Ghz). In this embodiment coils are placed on studs, lowering the parasitic capacitances.

Figure 8A:
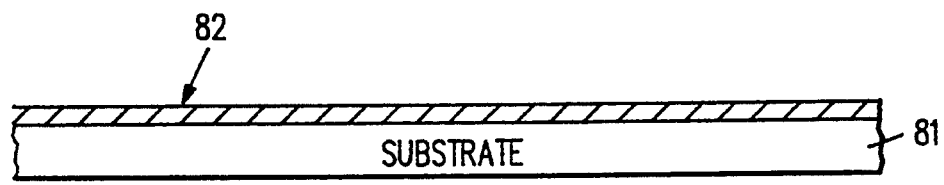
FIGS. 8a–8g depict cross-sectional views of the fabrication steps of an inductor placed on air bridge and having inherent low parasitic capacitances making it suitable for high frequency applications.

Referring to FIG. 8a, substrate 81 is a suitable substrate, for example heavily doped N type silicon. However, other substrates such as ceramic, glass, quartz, ferromagnetic materials, $Al_2O_3$/TiC are also appropriate, as is semiconductor materials of any doping type or dose.

A layer of dielectric material 82 is formed on the surface of substrate 81. In one embodiment, dielectric layer 82 is silicon dioxide thermally grown to approximately 10,000 Å in thickness. In an alternative embodiment in which substrate 81 is an insulating substrate such as glass, dielectric layer 82 is optional. Other types of dielectric, such as baked photoresist, alumina, quartz, silicon nitride, and the like, are suitable for dielectric layer 82.

Figure 8B:
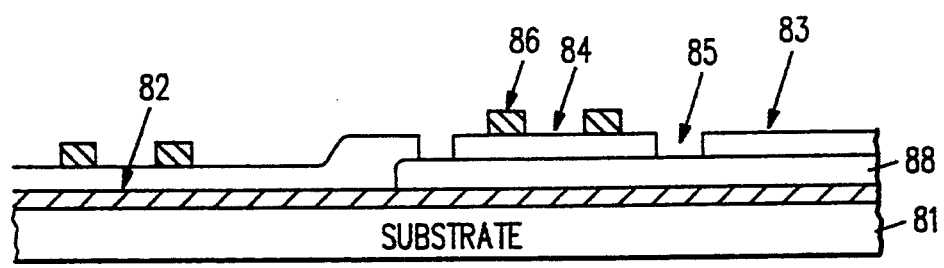

As shown in FIG. 8b, a conductive layer 83 is formed on dielectric layer 82. In one embodiment conductive layer 83 is formed of aluminum or an aluminum alloy to a thickness of approximately 5000 Å, although any suitable conductive material can be used, such as Cu, Cr, Au, and Ag. Conductive layer 83 is then patterned, for example by using standard photoresist and etching processes, to form a desired electrical interconnect pattern (not shown) and inductor coil terminal pad 88 which will ultimately allow external connection to one end of the to-be-formed inductor coil.

Another patterned layer of dielectric 84 is formed on the surface of the device, with underlying portions of conductive layer 83 exposed where electrical contact is to be made, for example to inductor coil terminal pad 88 at via 85. Dielectric layer 84 is formed of any suitable dielectric, such as photoresist, $SiO_2$, $Si_3N_4$, and $Al_2O_3$, and patterned using conventional photolithographic and etching techniques. In one embodiment, dielectric layer 84 is formed of silicon oxide, for example by deposition to a thickness of approximately 2000 Å to 10,000 Å, which is then patterned using conventional photolithographic techniques and oxide etching techniques.

Air bridges for the support of the to-be-formed inductor providing air as dielectric for the inductor coils are now fabricated using photolithography and dielectric deposition techniques as now described with respect to several alternative exemplary embodiments.

Figure 8C:
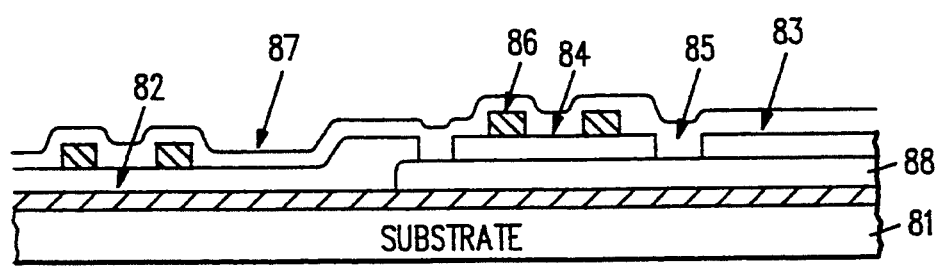
Figure 8D:
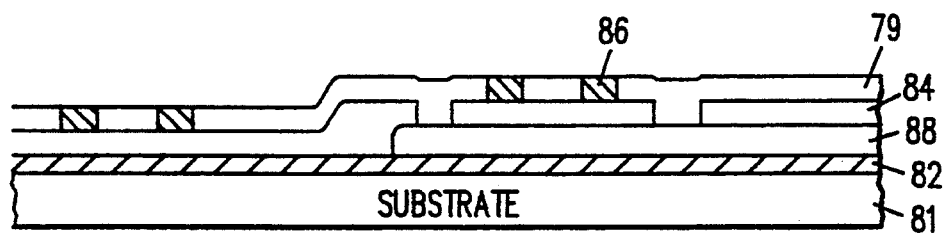
Figure 8E:
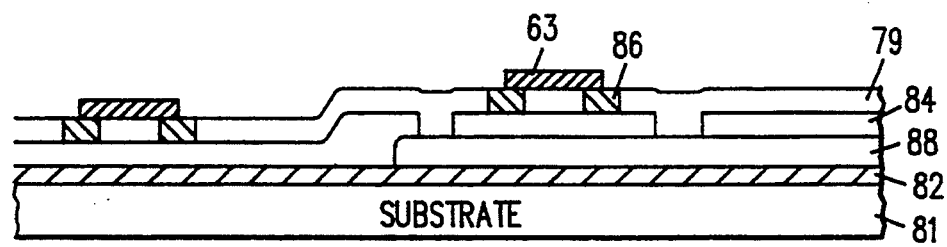

In one embodiment, as shown in FIG. 8b, a layer of dielectric such as photoresist, oxide, nitride, or the like, is formed to a desired thickness (i.e. approximately 3–10 microns) and defined by a conventional photoresist process to leave portions of the dielectric layer in the areas where studs 86 are to be formed. When photoresist is used as this dielectric layer, the photoresist layer then is baked in an inert environment or vacuum to form durable studs 86 of the baked photoresist material. As shown in FIG. 8c, the surface of the device is then coated with another layer 87 of dielectric material to a thickness of, for example, approximately 2–10 microns and removed from the tops of studs 86 using conventional photolithography and etching techniques to planarize the surface and thus providing a new layer 79 of dielectric between adjacent ones of studs 86, as shown in FIG. 8d. When photoresist is used as dielectric layer 79, it is then baked (for example at approximately 100° C. for approximately 30 minutes in a vacuum or inert environment), which makes this new photoresist layer somewhat durable, but not as durable as baked photoresist studs 86. This will allow layer 79 of photoresist to be later removed without disturbing the durable baked photoresist studs 86, as will be described later. In any event, in accordance with the teachings of this invention dielectric layer 79 is formed which can be selectively etched with respect to dielectric studs 86. Thus, for example, as has been described, studs 86 may be formed of hard baked photoresist while dielectric layer 79 is formed of a "soft bake" photoresist, or studs 86 may be formed of a nitride or nitride protected oxide and dielectric layer 79 is formed of oxide, nitride, glass, or photoresist which can be removed without damaging studs 86, or studs 86 are formed of oxide and dielectric layer 79 is formed of glass or photoresist which can be removed without adversely affecting the integrity of studs 86. Alternatively, for example, studs 86 are formed of baked photoresist or and dielectric layer 79 is formed of glass, oxide, nitride, which can be removed without adversely affecting the integrity of studs 86. Yet another alternative is to form studs 86 of $Al_2O_3$ and dielectric layer 79 of baked photoresist, oxide, nitride, or other material which can be selectively removed without adversely affecting studs 86.

The inductor coil is now formed on the surface of dielectric layer 79, in any one of a number of convenient ways. In one embodiment, a seed layer is used prior to electroplating in a selected pattern the inductor coil pattern, as was described previously with respect to the embodiment of FIGS. 6a–6f. Alternatively, conventional metal sputtering or deposition techniques and selective patterning is used to form a patterned metalization layer including a desired interconnect pattern and inductor coil 63, as has been described previously with respect to the embodiment of FIGS. 7-1 and 7-2. This results in the formation of the structure as shown in the cross-sectional view of FIG. 8e, including the inductor coil 63 formed above studs 86.

Figure 8F:
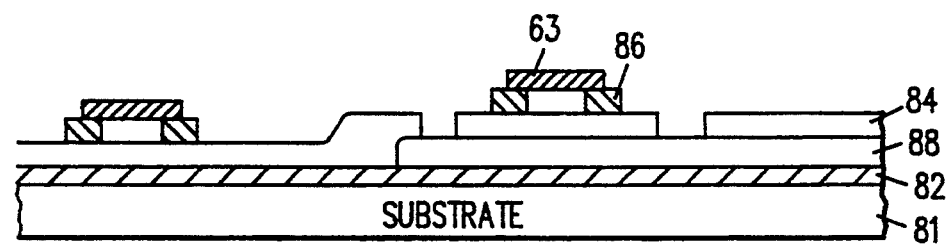
Figure 8G:
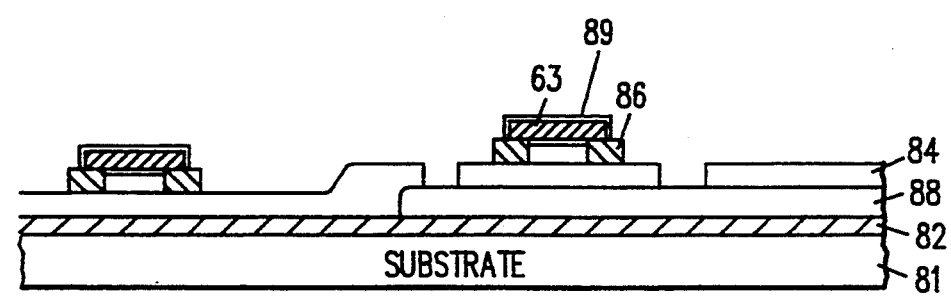

Air bridges are now formed, as shown in FIG. 8f, by removing dielectric layer 79, including, if desired, from under inductor coils 63, for example by a wet etch such as dilute (e.g. 10:1) HF, which is particularly suitable when oxide or glass is used as the dielectric layer 79 to be removed, or by an acetone wash when dielectric layer 79 is photoresist. If desired, as shown in FIG. 8g, a passivation layer 89 on the surface of the device including the surfaces of inductor coils 63, followed by a pad mask to expose those portions of underlying metalization to which bonding is to be performed. This passivation layer can comprise oxide, glass, nitride, or photoresist, or suitable combinations of such layers. If photoresist is used as a passivation layer, it is preferable to include a photoresist cure process at approximately 200°-300° C. in an inert environment or vacuum, or a polymerization step (for example using an electron beam) to harden the photoresist, making it more durable. Passivation layer 89 also serves to help adhere or "clamp" inductor coils 63 to their supporting studs 86, as is more fully described later.

In embodiments of this invention in which inductor coils are supported by studs above air bridges, as in the exemplary embodiment of FIGS. 8a–8g, subsequent processing of these coils could cause damage if the inductor coils are not kept in place or physically "clamped" to a supporting structure.

In one embodiment, wafers are processed to the formation of the studs 86, for example as has been described previously. Coils are then formed, for example as has been previously described. An example of such a structure is shown in the cross-sectional view of FIG. 8f, with inductor coil 63 hanging on studs 86 fabricated on substrate 81. To form a structure for clamping inductor coil 63 to studs 86, another layer of dielectric material 89 is formed on the surface of the device. In one embodiment, this layer of material 89 is photoresist applied in a conventional manner to the surface of the device to a thickness of approximately 1-5 microns, although it is preferred to use a relatively thin layer of photoresist to allow easier removal from the underside of inductor coils 63. This layer of material 89 is then patterned using conventional photolithographic and etching techniques to remain only on studs 86 and the portions of inductor coil 63 which rests on studs 86. If photoresist is used as the material for layer 89, it is preferably baked, for example at approximately 200°-300° C. in a vacuum or an inert environment, or stabilized with an electron beam process. If desired, inductor coils 63 are passivated, for example with oxide, nitride, or with a thin coating of photoresist (for example approximately 0.5 microns). Such a passivation layer (not shown) is then patterned to expose underlying areas where electrical contact is to be made. If photoresist is used as the passivation layer, it is preferably hardened by baking in a vacuum or an inert environment at approximately 200°-300° C., or stabilized with an electron beam process.

Alternatively, when planarization layer 79 is of a material which can be selectively removed with respect to the clamping layer (such as when planarization layer 79 is oxide and the clamping layer is photoresist), clamping is, if desired, performed by the formation of a clamping layer prior to the removal of planarization layer 79, in which case planarization layer 79 is selectively removed without adversely affecting planarization layer 79.

In an alternative embodiment, a separate clamping layer is not used, and the final passivation layer is used to clamp inductor coils 63 as well as to insulate the coils and other structures on the device.

Figure 9:
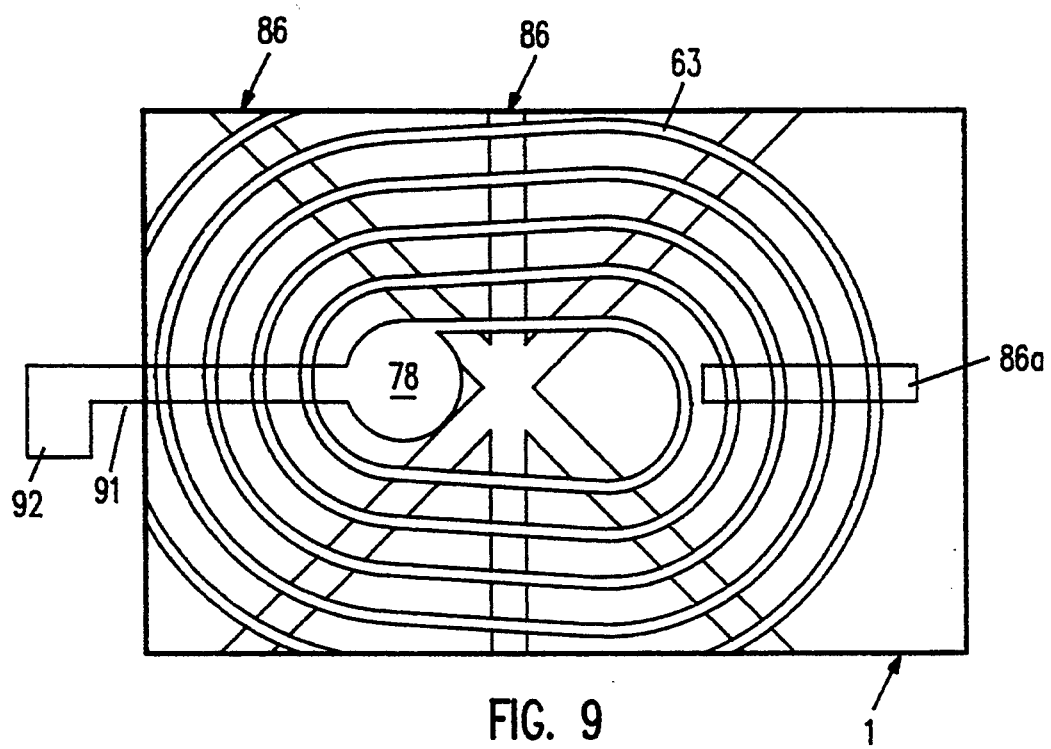
FIG. 9 is a top view of one embodiment of an air bridge inductor fabricated in accordance with the present invention.

FIG. 9 shows the plan view of a portion of one embodiment of this invention constructed per the fabrication process of FIGS. 8a–8e, in which studs 86 are used to suspend inductor coil 63 in air, or other suitable dielectric material formed beneath inductor coil 63 and between adjacent legs of studs 86. In addition to supporting inductor coils 63, studs 86 serve to suspend interconnect metallization, for enhanced performance at high frequencies. As shown in FIG. 9, inductor coil terminal pad 78 is connected by metalization layer 91 to bonding pad 92 beneath and insulated inductor coil 63.

If desired, additional stud portions such as 86a are used which need not be connected with other studs 86. This allows adequate support for inductor coil 63 while improving the dielectric constant associated with inductor coil 63.

FIGS. 10a–10i depict a fabrication process flow for the fabrication of high inductance, low frequency inductors, in accordance with one aspect of the present invention. In this embodiment, inductor coils are fabricated with a high permeability core such as Ni/Fe, sandust, ferrites, or other high permeability materials, based on permeability and frequency response characteristics. This use of a high permeability core provides an inductor with increased inductance value. Because permeability of Ni/Fe decreases with increasing frequency, the inductor of this embodiment is suitable for low frequency (approximately 0–50 MHz) applications. However, other core materials may also be used and when such core material provides high permeability to higher frequencies, the inductor so constructed will be suitable for applications at such higher frequencies. Such alternative core materials include sandust, iron, ferrites, and the like.

The inductance value provided by the inductor so formed is increased by wrapping the inductor coils around a high permeability material such as Ni/Fe. The inductance of the inductor is increased directly by the permeability of the material used as core. One example of a material suitable for use as the core material of this embodiment is Ni/Fe, where Fe is within the range of approximately 20–60% by weight.

Figure 10A:
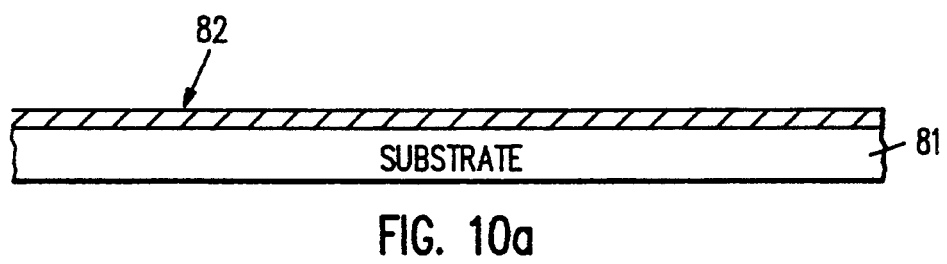
FIGS. 10a–10i are cross-sectional views depicting an inductor fabricated with a magnetic core in accordance with one embodiment of this invention.

As shown in FIG. 10a, a substrate 81 is used, which may be any convenient substrate material such as glass, quartz, $Al_2O_3$/TiC/alumina, silicon, ferromagnetic materials, or other insulating or semiconducting materials. A layer of insulating dielectric 82 is formed on the surface of substrate 81, for example by the deposition or growth of oxide, nitride, or a sandwich of oxide and nitride. In the event that substrate 81 is of an insulating material, insulating layer 82 is optional. In the event a semiconductor substrate is used, such as heavily doped silicon, where the contact to one end of the inductor is to be made through substrate 81, conventional photolithography and etching steps are used to provide a via (not shown) through insulating layer 82 to allow such electrical connection to a portion of substrate 81.

In embodiments in which substrate 81 is of an insulating material or when electrical contact to the to-be-formed inductor is to be made by a conductive layer underlying the inductor and above substrate 81, such a conductive layer is provided, for example, by conventional metallization processes such as deposition or sputtering of aluminum, which conductive layer is then patterned using conventional photolithographic and etching processes to provide the desired metallization interconnect pattern.

In one embodiment, insulating layer 82 is formed of baked photoresist in order to provide a high integrity insulation layer which also reduces the capacitance between the to-be-formed inductor and substrate 81. This is particularly useful when substrate 81 is a heavily doped semiconductor material such as silicon. Such a baked photoresist layer 82 is formed, for example, by a photoresist process, which defines the areas where photoresist is to remain, followed by baking of the photoresist between approximately 200° C. and 300° C. in an inert environment or vacuum. Alternatively, photoresist is stabilized with an electron beam process.

Figure 10B:
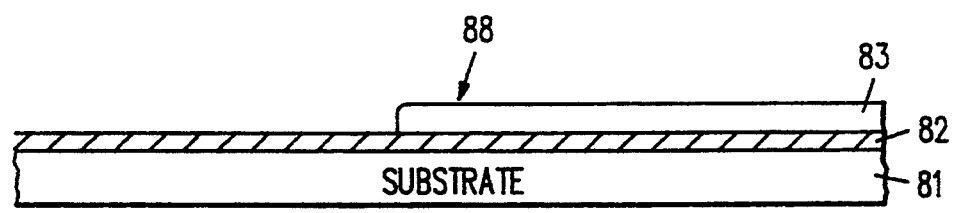

As shown in FIG. 10b, a metallization layer 83 is formed and patterned to a desired electrical interconnect pattern, including inductor coil terminal pad 88 to which electrical connection is made to one end of the to-be-formed inductor. Metalization layer 83 is formed of any convenient material, such as aluminum, and patterned using conventional methods.

Figure 10C:
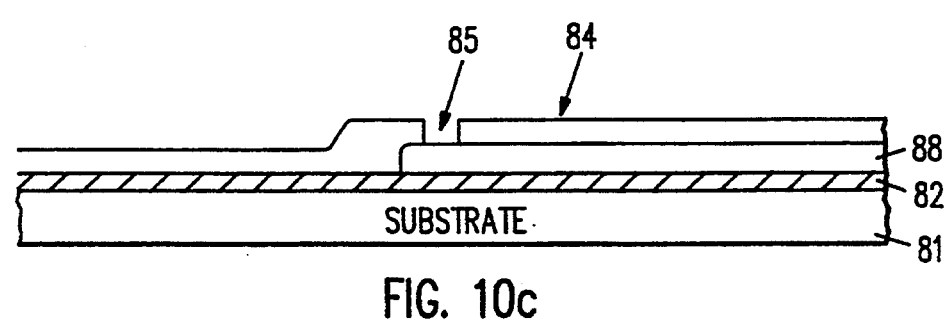

Referring to FIG. 10c, a dielectric layer 84 is formed and patterned to expose those portions of the metalization interconnect layer (such as inductor coil terminal pad 88 at via 85) to which electrical connection is to be made by subsequently formed layers. Dielectric layer 84 is, for example, oxide, nitride, baked photoresist, or other ceramic or dielectric materials.

Figure 10D:
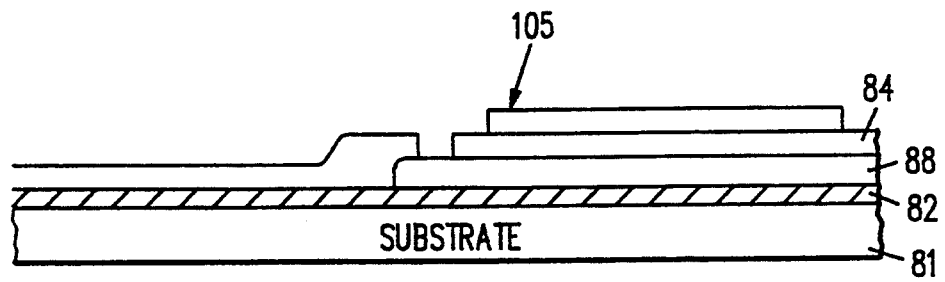

As shown in FIG. 10d, a layer of core material 105 is formed, having a desired permeability. Such core material is, for example, Ni/Fe, with Fe being within the range of approximately 20–60% by weight. Other magnetic core materials can be used, such as Ni/Fe, iron, sandust, ferrites, and the like. In one embodiment, core material is formed as layer 105 by conventional deposition or sputtering techniques. Alternatively, core material is formed as layer 105 by electroplating core material onto a previously formed seed layer (not shown), with a convenient seed layer being formed of Ni/Fe, for example of approximately 1000 Å. The target percentage of Fe in the Ni/Fe core material is achieved by adjusting the percentage of Fe and Ni and their ratio in the electroplating bath. Such a seed layer is formed, for example, by conventional deposition or sputtering techniques, with the core material subsequently being electroplated to the seed layer, for example to a thickness within the range of approximately 1 to 5 microns.

The pattern of the core material layer 105 is made by conventional photolithographic and etching techniques, when core material layer 105 is formed as a continuous layer on the surface of the device by either deposition, sputtering or seed layer/electroplating, or the pattern of core material layer 105 is formed by masking, for example with photoresist, those portions of a seed layer which is not to be electroplated. In this event, following the selective electroplating step, the photoresist is removed, as is those portions of the seed layer which were previously masked by the photoresist and thus not electroplated with core material, much as has been previously described with respect to the formation of the seed layer and electroplated inductor coils of the embodiment of FIGS. 6a–6f.

Figure 10E:
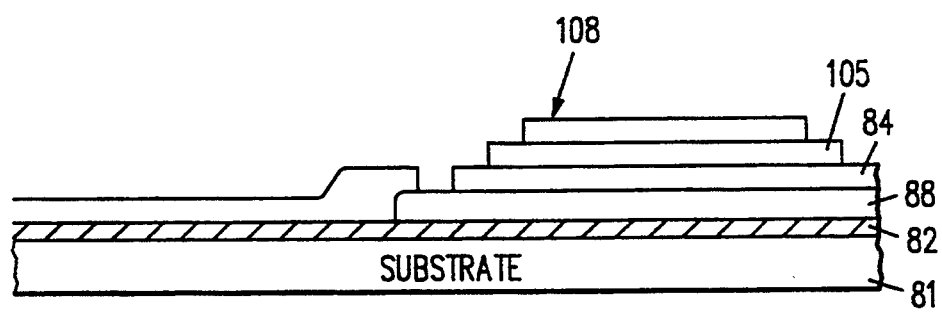

Referring to FIG. 10e, another layer of insulating material 108 is formed above core material layer 105. As is the case with other insulating layers of this and previous embodiments, when oxide or the like is used as insulating material 108, it is formed to a thickness of, for example, approximately 1000 Å to 5000 Å; when photoresist is used, it is formed to a thickness of approximately 1 to 5 microns. Insulating layer 108 is formed, for example, of oxide, nitride, or baked photoresist using conventional photoresist techniques followed by a bake in a vacuum or inert environment at approximately 200°–300° C., or stabilized with an electron beam process.

Figure 10F:
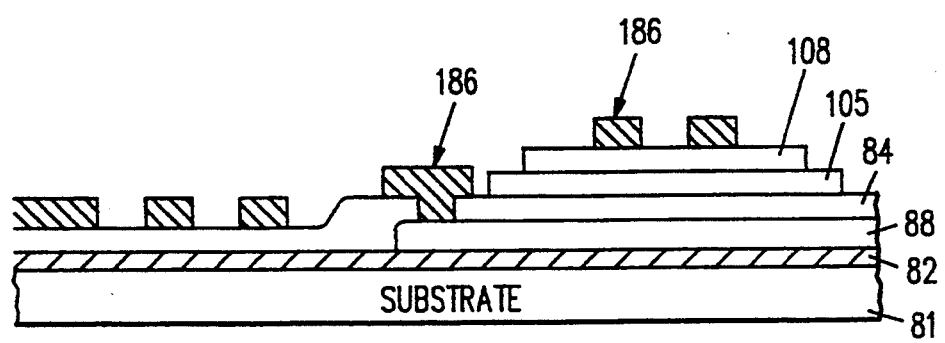

Next, as shown in FIG. 10f, inductor coils and electrical interconnects 186 are formed on insulating layer 108. FIG. 10f shows examples of inductor coils formed with and without the use of core material, allowing different inductor characteristics to be achieved on the same substrate. Alternatively, only a portion of a single inductor need be formed with core material, in order to provide a desired amount of permeability for any given inductor. Inductor coils and electrical interconnects 186 are formed as previously described with reference to the embodiment of FIGS. 6a–6f (or FIGS. 7-1 and 7-2), i.e. by conventional metallization and patterning, or by the formation of a seed layer which is masked to allow a selective electroplating operation.

Figure 10G:
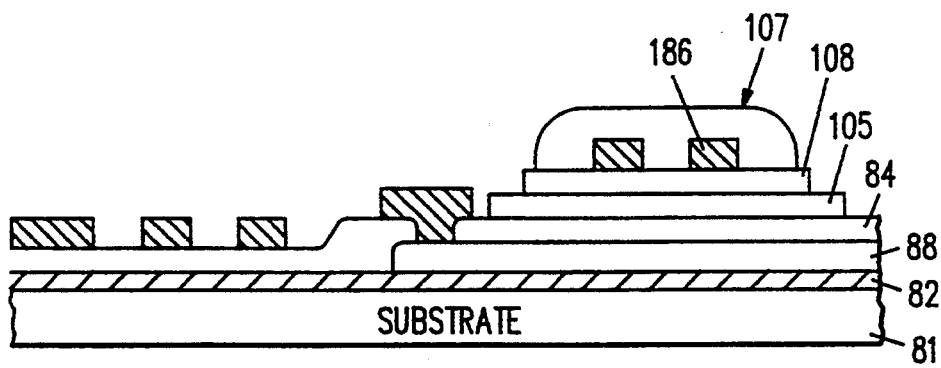

Referring to FIG. 10g, insulating layer 107 is formed, and may, if desired, cover only those inductor coil portions which are to have a core material. In one embodiment, insulating layer 107 is formed of baked photoresist, for example by forming a conventional layer of photoresist followed by a photoresist bake in a vacuum or an inert environment at a temperature between approximately 200°–300° C., or stabilized by an electron beam process. Insulation layer 107 is patterned, either before or after baking when baked photoresist is used, to allow subsequent electrical connection through vias (not shown) in insulation layer 107 and to remove insulation layer 107 from areas where it is not desired, for example in areas of inductors which do not include core material. This is desirable in order to improve the quality factor or "Q" of the inductor.

Figure 10H:
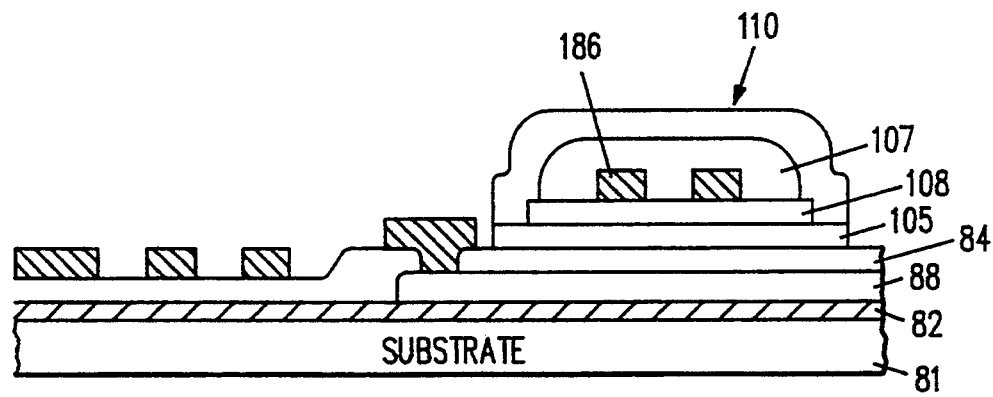

As shown in FIG. 10h, to form the upper and central (i.e. that portion located in the center of an inductor coil rather than between individual coil wires of an inductor) portions of the core, another layer of core material 110 is formed in any convenient manner, such as has been previously described with reference to the formation of core material layer 105. In one embodiment, core material layer 110 makes contact with core material layer 105, providing, in essence, a continuous core.

Figure 10I:
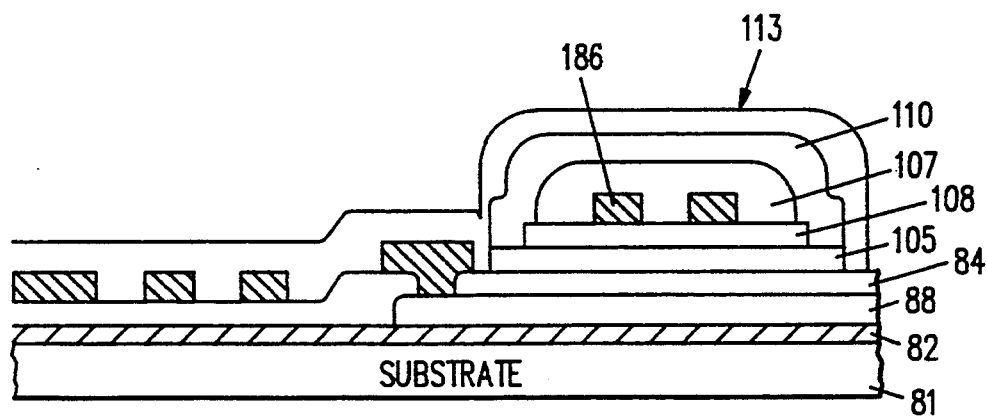

As shown in FIG. 10i, if desired the entire surface of the device is passivated, for example using conventional techniques using oxide, nitride, or photoresist as the passivation layer 113. Conventional photolithography and etching techniques are then used to pattern passivation layer 113, removing passivation material from areas through which electrical connection is to be made. In one embodiment, when photoresist is used as passivation layer 113, the layer of photoresist is patterned prior to a bake or electron beam process to make the photoresist more durable.

In accordance with the teachings of this invention, novel thin film inductors are conveniently fabricated on a substrate. If desired, that substrate can include thick film or thin film resistors, capacitors, or both, as well as semiconductor devices such as diodes, Schottky diodes, zener diodes, bipolar transistors, and MOS transistors. In one such embodiment, one or more capacitors and/or resistors are fabricated, for example, as taught by copending U.S. patent application Ser. No. 08/025,600, filed Mar. 3, 1993 on an invention of Rao et al entitled "Semiconductor Device with Integrated RC Network and Schottkey Diode," and assigned to California Micro Devices Corporation, the assignee of this patent application. After fabrication of the capacitors and resistors, a pad mask is used to open bonding pads or interconnect vias to allow electrical connector to capacitors and/or resistors, as well as any desired portion of the underlying semiconductor devices. An inductor is then fabricated in accordance with the teachings of the present invention, and appropriately electrically connected to other devices on the substrate. If desired, the inductor is conveniently fabricated on the top of a resistor and/or capacitor areas, as shown in the previously described cross-sectional view of FIG. 5, in order to save substrate circuit area. Alternatively, the inductor can be fabricated in an area not overlying a resistor or a capacitor or active semiconductor device (for example on an area covered with a layer of oxide), thereby minimizing stray capacitance and providing improved inductor performance. Alternatively, the inductor can be fabricated as taught by this invention prior to the fabrication of one or both thin film resistor or capacitor devices providing that the fabrication steps used to fabricate the resistor and/or capacitor are not deleterious to the integrity of the inductor previously formed. Furthermore, if desired, the inductor and/or thin film resistor and capacitor is fabricated on the backside of a semiconductor substrate in which one or more semiconductor devices are fabricated on the front side.

Figure 11:
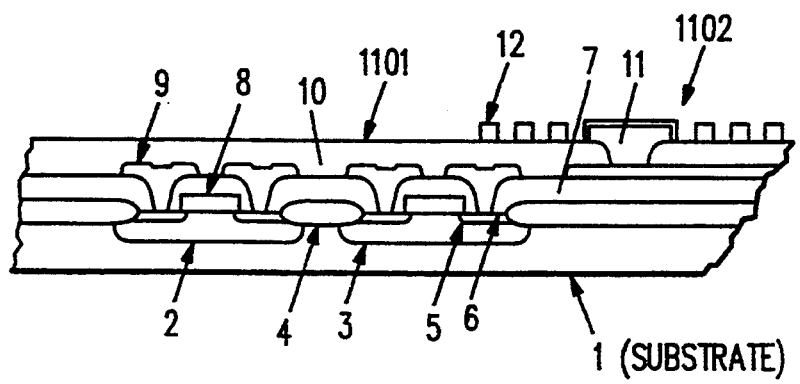
FIG. 11 depicts a cross sectional view of an inductor fabricated in accordance with one embodiment of this invention which is integrated with a semiconductor device.
Figure 12:
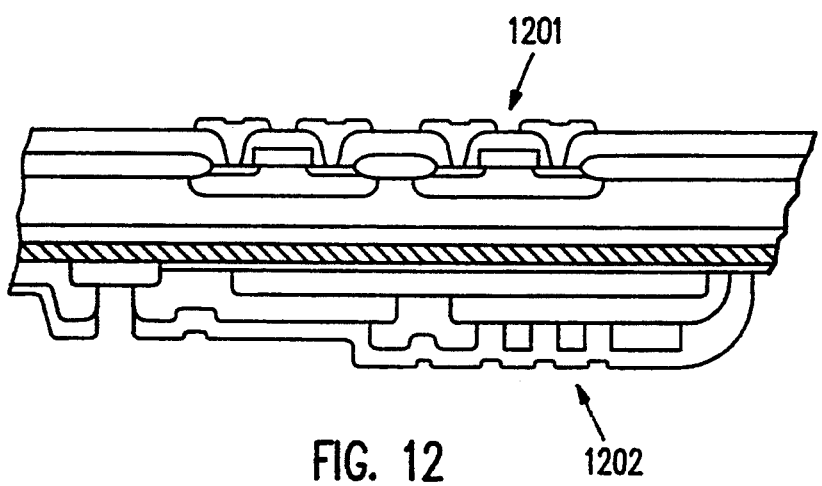
FIG. 12 is a cross-sectional view depicting one embodiment of this invention in which semiconductor devices are fabricated on one surface of a substrate and passive components such as inductors are fabricated on the opposite surface of the substrate.

FIG. 11 depicts a cross-sectional view of an inductor 1102 fabricated in accordance with the teachings of this invention together with a semiconductor structure 1101, such as a CMOS device. Naturally, it will be appreciated by those of ordinary skill in the art that semiconductor devices other than CMOS devices, including diodes, N-channel or P-channel MOS devices, bipolar devices, and bi-CMOS devices, can also be fabricated in conjunction with an inductor constructed in accordance with the teachings of this invention on the same substrate. In one embodiment of this invention, the semiconductor device is fabricated in a semiconductor substrate prior to the steps required to fabricate an inductor in accordance with the teachings of this invention. If desired, one or more resistors and/or capacitors can also be fabricated either as part of the fabrication process of the semiconductor device, or subsequent to the fabrication of the semiconductor device. Appropriate interconnections are made between the various active and passive devices, as desired. If desired, the inductor is fabricated on top of active semiconductor devices, thereby minimizing area requirements of the substrate. Alternatively, the inductor can be fabricated above one or more resistor and/or capacitor devices or in another alternative, is formed in its own portion of the substrate, thereby minimizing capacitive coupling between the inductor and other components. In one such embodiment, the inductor is fabricated above a layer of oxide. Furthermore, if desired, the inductor and/or thin film resistor and capacitor 1202 are fabricated on the backside of a semiconductor substrate in which one or more semiconductor devices 1201 are fabricated on the front side, as shown in FIG. 12.

In one embodiment inductor 1102 is fabricated after finishing processing of semiconductor devices/circuits. However if semiconductor processing temperatures are low, the processing of the inductor could be done prior to fabrication of the semiconductor devices/circuits.

In one embodiment the inductor is fabricated after completion of the fabrication of the resistor/capacitor network. If the process temperature for the fabrication of resistor/resistor network is low enough as not to destroy the characteristics of the fabricated inductor, the inductor is conveniently fabricated prior to the fabrication of resistor/capacitor networks.

Figure 13:
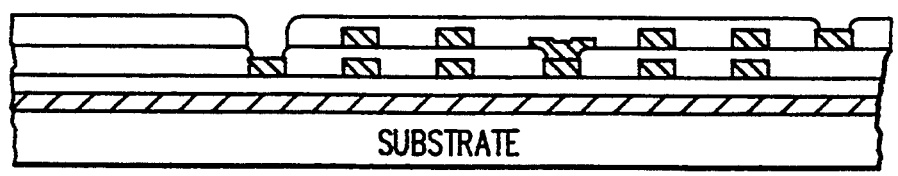
FIG. 13 is a cross sectional view of one embodiment of a multiple layer thin film inductor structure of this invention.

In another embodiment of this invention, a multiple layer inductor coil is fabricated, as shown in FIG. 13, utilizing similar processing steps herein described, but including additional steps to provide inductor coils formed above and insulated from the first layer inductor coil. If desired, each layer can include core material in selected areas, as previously described with respect to the embodiment of FIGS. 10a–10i. Also, as will be appreciated by those of ordinary skill in the art in light of the teachings of this invention, such a multilayer inductor coil can readily be fabricated in conjunction with one or more layers of thin film resistors and capacitors, as well as with semiconductor devices.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A method for fabricating an electronic device comprising the steps of:
   utilizing a substrate having a first and a second surface;
   forming a first conductive layer above said first surface of said substrate;
   forming a patterned dielectric layer above said first conductive layer; and
   forming a patterned thin film conductor above said patterned dielectric layer in a pattern to provide an inductor having a desired inductance value and which makes electrical contact with said first conductive layer.

2. A method as in claim 1 wherein said substrate comprises a conductive or semiconductive material, and which further comprises the step of forming an insulating layer above said first surface of said substrate, thereby insulating said first conductive layer from said substrate.

3. A method as in claim 2 wherein said substrate comprises silicon, $Al_2O_3$-TiC, or a conductive ferromagnetic material.

4. A method as in claim 2 which further comprises the step of forming vias in said layer of insulation to allow electrical connection between said substrate and one or both of said conductive layer and thin film conductor.

5. A method as in claim 1 wherein said substrate comprises an insulating substrate.

6. A method as in claim 2 wherein said substrate comprises a semiconductive material and which method further comprises the step of forming one or more semiconductor devices in said semiconductive substrate.

7. A method as in claim 6 wherein said inductor is formed adjacent to said one or more semiconductor devices.

8. A method as in claim 6 wherein said inductor is formed above said one or more semiconductor devices.

9. A method as in claim 6 wherein said semiconductor devices are formed on said second surface of said substrate.

10. A method as in claim 1 which further comprises the steps of fabricating one or more devices, selected from the group consisting of thin film resistors and capacitors, on said substrate.

11. A method as in claim 10 wherein said inductor is formed above one or more of said thin film resistors and capacitors.

12. A method as in claim 10 wherein said inductor is formed adjacent one or more of said thin film resistors and capacitors.

13. A method as in claim 10 wherein said substrate comprises semiconductor material containing one or more semiconductor devices and in which said one or more inductors, resistors, and capacitors are fabricated above at least one of said one or more of semiconductor devices.

14. A method as in claim 1 which further comprises the step of forming a core material on at least one side of said inductor.

15. A method as in claim 1 which further comprises the step of forming a core material on both top and bottom of said inductor.

16. A method as in claim 14 wherein said core material comprises iron, NiFe, sandust, or a ferromagnetic material.

17. A method as in claim 15 wherein said core material comprises iron, NiFe, sandust, or a ferromagnetic material.

18. A method as in claim 1 which further comprises the step of forming a set of studs for the formation of said patterned thin film conductor such that said patterned thin film conductor is supported by said studs and, between said studs, is separated from underlying layers.

19. A method as in claim 18 which further comprises the step of forming a clamping layer on said conductive layer to attach said conductive later to said studs.

20. A method as in claim 19 which further comprises the step of forming a passivation layer on the surface of the device.

21. A method as in claim 18 which further comprises the step of passivating said thin film with photoresist.

22. A method as in claim 1 wherein said first conductive layer comprises a resistive layer serving as one or more resistor devices.

23. A method as in claim 1 wherein said first conductive layer comprises a material selected from the group of materials consisting of aluminum, copper, silver, gold, polycrystalline silicon, and alloys thereof.

24. A method as in claim 1 which further comprises a step of forming a capacitor having said substrate serving as its first plate and said first conductive layer serving as its second plate.

25. A method as in claim 1 wherein said first conductive layer is patterned to form one or more electrical interconnects.

26. A method as in claim 25 wherein said first conductive layer also serves as one plate of a capacitor.

27. A method as in claim 1 wherein said first conductive layer comprises a resistive material selected from the group of materials consisting of TaN, nichrome, and polycrystalline silicon.

28. A method as in claim 5 wherein said substrate comprises glass, quartz, or ceramic material.

29. A method as in claim 6 wherein said step of forming said one or more semiconductor devices is performed prior to said step of forming a patterned dielectric layer above said first conductive layer and prior to said step of forming a patterned thin film conductor, wherein said step of forming a patterned dielectric layer and said step of forming a patterned thin film conductor are performed at sufficiently low temperatures to prevent a deterioration of said semiconductor devices.

30. A method as in claim 6 which further comprises the steps of fabricating one or more devices, selected from the group consisting of thin film resistors and capacitors, on said substrate.

31. A method as in claim 30 wherein said inductor is formed above one or more of said thin film resistors and capacitors.

32. A method as in claim 30 wherein said inductor is formed adjacent one or more of said thin film resistors and capacitors.

33. A method as in claim 30 wherein said substrate comprises semiconductor material and in which said one or more inductors, resistors, and capacitors are fabricated above said semiconductor devices.

34. A method as in claim 30 wherein said first conductive layer is patterned to form one or more electrical interconnects.

35. A method as in claim 10 wherein said first conductive layer is patterned to form one or more electrical interconnects.

36. A method as in claim 13 wherein said first conductive layer is patterned to form one or more electrical interconnects.

37. A method for fabricating an electronic device utilizing a substrate comprising the steps of:
forming a first patterned conductive layer above said substrate;
forming a first patterned dielectric layer, exposing those areas of said first conductive layer to which electrical contact is to be made; and
forming a second conductive layer on said first patterned dielectric layer in a pattern to form an inductor coil.

38. A method as in claim 37 wherein said substrate comprises a semiconductor or conductive material and wherein said method comprises the additional step of forming a base dielectric layer between said substrate and said first conductive layer.

39. A method as in the claim 38 wherein said step of forming said base dielectric layer comprises the step of forming said base dielectric layer in a pattern to expose those portions of said substrate to which electrical contact is to be made.

40. A method as in claim 37 wherein said substrate comprises glass, quartz, $Al_2O_3$/TiC, or ceramic materials.

41. A method as in claim 38 wherein said substrate comprises conductive ferromagnetic material or semiconductor material.

42. A method as in the claim 41 wherein said substrate comprises silicon.

43. A method as in claim 38 wherein said base dielectric layer comprises silicon dioxide of approximately 10,000 Å in thickness.

44. A method as in claim 37 wherein said first conductive layer comprises aluminum, copper, silver, gold, polycrystalline silicon, or an alloy thereof.

45. A method as in claim 44 wherein said first conductive layer is formed to a thickness of approximately 5,000 Å.

46. A method as in claim 37 wherein said first dielectric layer comprises one or more materials selected from the group of materials consisting of silicon dioxide and silicon nitride, formed to a thickness within the range of 2,000 to 10,000 Å.

47. A method as in claim 38 wherein said first dielectric layer comprises one or more materials selected from the group of materials consisting of silicon dioxide and silicon.

48. A method as in claim 38 wherein said base dielectric layer comprises a layer of baked photoresist.

49. A method as in claim 48 wherein said layer of baked photoresist is formed to a thickness within the range of approximately 1-5 microns.

50. A method as in claim 38 wherein said step of forming said base dielectric layer comprises the steps of:
applying the photoresist material to the top surface of said device; and
stabilizing said layer of photoresist.

51. A method as in claim 50 wherein said step of stabilizing comprises baking said photoresist.

52. A method as in claim 51 wherein said step of baking comprises baking within the range of approximately 200°–300° C. for approximately 6 to 12 hours in a vacuum or inert environment.

53. A method as in claim 50 wherein said step of stabilizing comprises polymerizing said photoresist.

54. A method as in claim 53 wherein said step of polymerizing is performed utilizing an electron beam.

55. A method as in claim 37 wherein said second conductive layer comprises aluminum, copper, silver, gold, or an alloy thereof.

56. A method as in claim 37 wherein said step of forming said second metallization layer comprising the steps of:
forming a seed layer of conductive material on the surface of the device in a pattern resembling the desired pattern of the to-be-formed conductive layer;
forming a layer of masking material on the surface of the device in a pattern to expose those portions of said seed layer where the inductor coil is to be formed;
electroplating additional metal material to exposed portions of said seed layer;
removing said masking layer; and
removing those portions of said seed layer not covered by said additional conductive material.

57. A method as in claim 56 wherein said seed layer comprises TiW, Cu, Pd, Ti, Ni, Cr, Ag, Au, NiFe, or an alloy thereof.

58. A method as in claim 57 wherein said seed layer comprises a first layer of TiW formed to a thickness of approximately 200 Å and a second layer of copper formed to a thickness of approximately 1,000 Å.

59. A method as in claim 56 wherein said additional metal material comprises copper, silver, or gold, or an alloy thereof.

60. A method as in claim 56 wherein said additional metal material is formed to a thickness in the range of approximately 3 to 10 microns.

61. A method as in claim 37 wherein said step of forming said inductor coil comprises the steps of:
forming a layer of metallization;
forming a mask in a desired pattern to protect those portions of said metallization layer which are to form said inductor coil; and
removing exposed portions of said metallization layer.

62. A method as in claim 37 which further comprises the step of forming a layer of passivation on the surface of the device.

63. A method as in 62 wherein said step of forming a layer of passivation comprises the step of forming a layer of photoresist.

64. A method as in claim 63 wherein said step of forming a layer of photoresist comprises forming a layer of photoresist to a thickness within the range of approximately 1 to 5 microns.

65. A method as in claim 63 which further comprises the step of stabilizing said layer of photoresist.

66. A method as in claim 65 wherein said step of stabilizing said layer of photoresist comprises the step of baking said photoresist.

67. A method as in claim 66 wherein said step of baking comprises baking within the range of approximately 200° to 300° C. for approximately 6 to 12 hours in a vacuum or inert environment.

68. A method as in claim 65 wherein said step of stabilizing comprises polymerizing said photoresist.

69. A method as in claim 68 wherein said step of polymerizing is performed utilizing an electron beam.

70. A method as in claims 37 wherein said step of forming a second conductive layer comprises the steps of:
forming a second layer of dielectric on said first dielectric layer, in areas where support studs are to be formed;
forming a third layer of dielectric material which is capable of being selectively etched with respect to said second layer of dielectric material;
removing said third layer of said material from above said support studs;
forming a patterned conductive layer above said second and third dielectric layers in a pattern defining an inductor coil; and
removing at least portions of said third layer of dielectric material beneath said inductor coil.

71. A method as in claim 70 wherein said second layer of dielectric material comprises a durable photoresist and said third layer of dielectric material comprises a layer of photoresist less durable than said second layer of dielectric material.

72. A method as in claim 70 wherein said second layer material of dielectric material comprises material selected from the group of materials consisting of oxide, nitride, and $Al_2O_3$.

73. A method as in claim 72 wherein said third layer of dielectric material comprises photoresist.

74. A method as in claim 72 wherein said third layer of dielectric material comprises material selected from the group of materials consisting of oxide, nitride, and $Al_2O_3$ other than the material used as said second layer of dielectric.

75. A method as in claim 72 wherein said second layer of dielectric material is formed to a thickness within the range of approximately 3 to 10 microns.

76. A method as in claim 72 wherein said third layer material is formed to a thickness from the range of approximately 2 to 10 microns.

77. A method as in claim 72 wherein said step of forming said third dielectric layer comprises the steps of:
applying photoresist material to the top surface of said device; and
stabilizing said layer of photoresist.

78. A method as in claims 77 wherein said step of stabilizing comprises baking said photoresist.

79. A method as in claim 78 wherein said step of baking comprises baking at approximately 100° C. for approximately 30 minutes in a vacuum or inert environment.

80. A method as in claim 70 wherein said step of forming said patterned conductive layer comprising the steps of:
forming a seed layer of conductive material on the surface of the device in a pattern resembling the desired pattern of the to-be-formed conductive layer;

forming a layer of masking material on the surface of the device in a pattern to expose those portions of said seed layer where the inductor coil is to be formed;

electroplating additional metal material to exposed portions of said seed layer;

removing said masking layer; and removing those portions of said seed layer not covered by said additional conductive material.

81. A method as in claim 80 wherein said seed layer comprises TiW, Cu, Pd, Ti, Ni, Cr, Ag, Au, NiFe, or an alloy thereof.

82. A method as in claim 80 wherein said seed layer comprises a first layer of TiW formed to a thickness of approximately 200 Å and a second layer of copper formed to a thickness of approximately 1,000 Å.

83. A method as in claim 80 wherein said additional metal material comprises copper, silver, or gold, or an alloy thereof.

84. A method as in claim 80 wherein said additional metal material is formed to a thickness in the range of approximately 3 to 10 microns.

85. A method as in claim 80 wherein said step of forming said patterned conductive layer comprises the steps of:

forming a layer of metallization;

forming a mask in a desired pattern to protect those portions of said metallization layer which are to form said inductor coil; and removing exposed portions of said layer of metallization.

86. A method as in claim 80 further comprises the step of forming a clamping layer above at least portions of said inductor coil.

87. A method as in claim 86 wherein said step of forming a clamping layer comprises the step of forming a layer of material selected from the group of materials selected from the group of materials consisting of oxide, nitride, and photoresist.

88. A method as in claim 86 wherein said step of forming a clamping layer is performed after said step of removing said third dielectric layer.

89. A method as in claim 86 wherein said step of forming a clamping layer is performed before said step of removing said third dielectric layer.

90. A method as in claim 85 which further comprises the step of forming a passivation layer.

91. A method as in claim 86 which further comprises the step of forming a passivation layer.

92. A method as in claim 85 wherein said step of forming a layer of metallization serving as inductor coils also forms portions of said layer of metallization serving as electrical interconnects.

93. A method as in claim 92 wherein at least a portion of said electrical interconnects are formed on support studs.

94. A method as in claim 37 wherein said step of forming said second conductive layer comprises the step of:

forming a layer of core material of a desired permeability, in a desired pattern;

forming a first layer of insulating material above said core material layer;

forming a second conductive layer in a pattern defining one or more inductor coils.

95. A method as in claim 94 which further comprises the steps of:

forming a second insulation layer above said second conductive layer; and forming a second layer of core material of a desired permeability above said second insulating layer.

96. A method as in claim 70 wherein said third layer of dielectric comprises material which can be selectively etched with respect to said studs.

97. A method as in claim 37 wherein said substrate comprises a ferromagnetic material.

98. A method as in claim 37 which further comprises the steps of forming one or more layers of ferromagnetic core material in the vicinity of said inductor coil.

99. A method as in claim 98 wherein said one or more layers of ferromagnetic core material comprise a layer of ferromagnetic material located below and insulated from said inductor coil.

100. A method as in claim 98 wherein said one or more layers of ferromagnetic core material comprise a layer of ferromagnetic material located above and insulated from said inductor coil.

101. A method as in claim 98 wherein said layer of ferromagnetic core material comprises Ni/Fe, sandust, iron, or ferrites.

102. A method as in claim 98 wherein said one or more layers of ferromagnetic core material comprise Ni/Fe, having Fe within the range of approximately 20 to 60 percent by weight.

103. A method as in claim 98 wherein said step of forming said one or more layers of ferromagnetic core material is performed by deposition or sputtering.

104. A method as in claim 95 wherein said step of forming said one or more layers of ferromagnetic core material comprises the steps of:

forming a seed layer in a desired pattern; and electroplating said ferromagnetic material onto said seed layer.

105. A method as in claim 104 wherein said seed layer is formed of Ni/Fe.

106. A method as in claim 104 wherein said seed layer is formed to a thickness of approximately 1,000 Å.

107. A method as in claim 104 wherein each said layer of ferromagnetic core material is formed to a thickness within the range of approximately 1 to 5 microns.

* * * * *